United States Patent
Jeong

(10) Patent No.: US 7,239,554 B2
(45) Date of Patent: Jul. 3, 2007

(54) NONVOLATILE MEMORY DEVICE AND METHOD OF IMPROVING PROGRAMMING CHARACTERISTIC

(75) Inventor: Jae-yong Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 67 days.

(21) Appl. No.: 11/133,286

(22) Filed: May 20, 2005

(65) Prior Publication Data

US 2006/0087889 A1    Apr. 27, 2006

(30) Foreign Application Priority Data

Oct. 21, 2004    (KR)    ............... 10-2004-0084480

(51) Int. Cl.
G11C 16/04    (2006.01)
G11C 16/06    (2006.01)
G11C 7/06    (2006.01)
G11C 5/14    (2006.01)
G11C 7/02    (2006.01)

(52) U.S. Cl. .................. 365/185.28; 365/185.21; 365/185.23; 365/185.25; 365/185.27; 365/189.07; 365/189.09; 365/207

(58) Field of Classification Search ........... 365/185.28, 365/185.23, 185.27, 185.25, 185.21, 189.07, 365/189.09, 207
See application file for complete search history.

(56) References Cited

U.S. PATENT DOCUMENTS

| | | | |
|---|---|---|---|
| 5,483,486 A * | 1/1996 | Javanifard et al. ..... | 365/185.17 |
| 5,519,654 A * | 5/1996 | Kato et al. ............. | 365/185.23 |
| 5,642,309 A | 6/1997 | Kim et al. | |
| 5,999,475 A * | 12/1999 | Futatsuya et al. ........... | 365/226 |
| 6,084,800 A * | 7/2000 | Choi et al. ............. | 365/185.23 |
| 6,266,270 B1 | 7/2001 | Nobukata | |
| 6,285,622 B1 * | 9/2001 | Haraguchi et al. .......... | 365/226 |
| 2003/0099125 A1* | 5/2003 | Kang ....................... | 365/145 |
| 2004/0120188 A1* | 6/2004 | Chih ..................... | 365/185.18 |
| 2005/0047214 A1* | 3/2005 | Kim et al. ............. | 365/185.28 |
| 2006/0017077 A1* | 1/2006 | Tanzawa ..................... | 257/261 |
| 2006/0044923 A1* | 3/2006 | Hahn et al. ............ | 365/230.06 |
| 2006/0087888 A1* | 4/2006 | Jeong .................... | 365/185.28 |
| 2006/0087890 A1* | 4/2006 | Jeong et al. ........... | 365/185.28 |
| 2006/0087891 A1* | 4/2006 | Jeong et al. ........... | 365/185.28 |
| 2006/0098491 A1* | 5/2006 | Jeong et al. ........... | 365/185.23 |
| 2006/0133147 A1* | 6/2006 | Lee et al. .............. | 365/185.18 |
| 2006/0146641 A1* | 7/2006 | Demone ..................... | 365/233 |

FOREIGN PATENT DOCUMENTS

| | | |
|---|---|---|
| JP | 2000-057791 | 2/2000 |
| KR | 1020000027300 A | 5/2000 |
| KR | 1020010010734 A | 2/2001 |
| KR | 1020010018711 A | 3/2001 |
| KR | 1020020039744 A | 5/2002 |

* cited by examiner

*Primary Examiner*—Amir Zarabian
*Assistant Examiner*—Ly Duy Pham
(74) *Attorney, Agent, or Firm*—Volentine & Whitt, PLLC

(57) ABSTRACT

A method of programming a non-volatile memory device includes activating a first pump to generate a bitline voltage, and after the bulk voltage reaches a target voltage, detecting whether the bitline voltage is less than a detection voltage. When the bitline voltage is less than the detection voltage, a second pump becomes active.

20 Claims, 6 Drawing Sheets

NONVOLATILE MEMORY DEVICE AND METHOD OF IMPROVING PROGRAMMING CHARACTERISTIC

CROSS-REFERENCE TO RELATED APPLICATIONS

This U.S. non-provisional patent application claims the priority under 35 U.S.C. § 119 of Korean Patent Application 2004-84480 filed on Oct. 21, 2004, the entire contents of which are hereby incorporated by reference herein in their entirety as if fully set forth herein.

BACKGROUND

The present invention relates to semiconductor memory devices and more particularly, to nonvolatile memory devices.

A flash memory device, as a kind of the nonvolatile memory device, is regarded as an electrically erasable programmable read only memory (EEPROM) in which plural memory sectors are erasable or programmable by a single programming operation. This means that while a typical EEPROM is only able to be erased or programmed for a single memory block at a time, the flash memory device is operable in high frequency and efficiency in the condition that a system employing the flash memory reads and writes data with other memory blocks at the same time. Flash memories and EEPROMs have limited lifetimes because insulation films around charge storage elements thereof are usually destroyed by erasing data several hundreds or thousands times.

The flash memory device stores information in a silicon chip thereof even without any power being applied. This means that the information stored in the chip is retained even if the power is interrupted. In addition, the flash memory device has resistance against physical shocks and provides a fast access time for reading. Owing to such merits, the flash memory device is usually employed as a storage unit in an apparatus powered by a battery.

Flash memory devices may be classified into NOR and NAND type devices, in accordance with the circuit patterns of the logic gates in the devices.

A flash memory has memory cells including a transistor array that stores information or data, each cell storing 1-bit of information. Meantime, a multi-level cell is designed to store more than one bit by varying the amount of charges accumulated in a floating gate thereof.

In a NOR flash memory device, each cell is similar to a typical MOSFET transistor, except that it is constructed with two gates therein. The first one is a control gate (CG) that is the same as that of other MOS transistors, while the second one is referred to as a floating gate (FG) that is electrically isolated, being surrounded by an insulation film. The floating gate is interposed between the control gate and the substrate (or a bulk material). Since the floating gate is electrically isolated by the insulation film, electrons are held and remain in the floating gate to store information. Electrons settled in the floating gate cause an electric field from the control gate to be varied (partially offsetting the electric field), which changes a threshold voltage of the memory cell. Thus, when a specific voltage is applied to the control gate to read data from the cell, a current may or may not flow through the memory cell in accordance with the threshold voltage thereof. Such current flow is regulated by the amount of charge accumulated in the floating gate. A data value of '1' or '0' is detected in accordance with whether or not there is current flow which corresponds to the data stored in the memory cell. In the multi-level cell storing more than one bit per cell, the amount of electrons held in the floating gate may be detected according to the amount of current flowing through the memory cell, rather than the presence or absence of current, in practice.

A NOR flash memory cell is programmed by applying a program voltage to a control gate, applying a high voltage of about 5~6V to a drain, and grounding a source, which stores in the cell a specific data value. With such a bias condition, a large current flows from the drain to the source. This programming scheme is referred to as hot electron injection. In erasing the NOR flash memory cell, a high voltage gap is established between the control gate and the substrate (or bulk), which induces a Fowler-Nordheim tunneling effect to release the electrons from the floating gate. A cell array of the NOR flash memory device is usually divided into blocks or sectors that are erased as a unit. Memory cells belonging to a block are erased at the same time in a single erasing cycle. Otherwise, a programming operation in the NOR flash memory device is carried out in the unit of a byte or word.

For the purpose of regulating a distribution profile of threshold voltages of programmed memory cells, an incremental step pulse programming scheme (ISPP) is generally employed. By the ISPP scheme, as illustrated in FIG. 1, the program voltage $V_{WL}$ applied to a wordline is stepped up during an iteration of programming loops over operating cycles in a programming mode. Each programming loop includes a programming period and a program verifying period, as is well known. The program voltage VWL increases by a predetermined step voltage $\Delta V$. During the sequence of the programming operation, at each program loop the threshold voltage Vt of the cell being programmed is increased by the predetermined voltage step $\Delta V$. Therefore, the step voltage $\Delta V$ needs to be made smaller in order to narrow the width of the distribution profile of the threshold voltages. As the step voltage $\Delta V$ is made smaller, the number of programming loops becomes larger. Thus, the number of the programming loops is determined so as to optimize the threshold voltage distribution profile without limiting the performance of the memory device.

An exemplary programming scheme for a nonvolatile memory device is disclosed in U.S. Pat. No. 6,266,270 entitled "Non-volatile semiconductor memory and programming method of the same." Also, circuits for generating program voltages have been proposed in U.S. Pat. No. 5,642,309, entitled "Auto-program circuit in a nonvolatile semiconductor memory device," and in Korean Patent Publication No. 2002-39744 entitled "Flash memory device capable of preventing disturb and method of programming the same."

In programming a NOR flash memory device by means of the ISPP scheme, as aforementioned, a wordline voltage of 10V is applied to the control gate of the flash memory cell, a bitline voltage of 5~6V is applied to the drain, and a voltage less than 0V (e.g., −1V) is applied to the bulk (or substrate) of the flash cell. In general, the current flowing through the flash memory cell, Icell, is $(V_{GS}-Vt)^2$, where Vt is proportional to a threshold voltage of the flash memory cell and $V_{GS}$ is a gate-to-source voltage of the flash memory cell. The bitline voltage is generated and maintained by a charge pump (not shown). If the amount of current flowing through the memory cell is greater than the capacity of the charge pump for the bitline voltage, the bitline voltage drops below a predetermined voltage level. With a drop of the drain voltage (that is, the bitline voltage), it becomes difficult for the threshold voltage of the flash cell to increase up to a desired level in a certain programming loop, as shown by the broken line in FIG. 1. In particular, during a programming operation with the ISPP scheme, as the difference between the wordline voltage and the threshold voltage becomes larger in accordance with the repetition of the programming loops, the programming characteristic may be gradually degraded to result in programming failures.

Accordingly, it would be desirable to provide a nonvolatile memory device with improved programming characteristics.

In particular, it would be desirable to provide an advanced technique to prevent programming failure due to a drop of the bitline voltage during a programming operation.

It would also be desirable to provide a nonvolatile memory device able to maintain a bitline voltage with stability during a programming operation.

It would further be desirable to provide a nonvolatile memory device variably controlling the capacity of a charge pump for a bitline voltage in a programming operation.

SUMMARY OF THE INVENTION

Accordingly, in one aspect of the invention, a method of programming a nonvolatile memory device comprises generating a bitline voltage from activation of a first pump; detecting whether the bitline voltage is lower than a detection voltage after the bitline voltage reaches a target voltage; and activating a second pump when the bitline voltage is lower than the detection voltage.

Beneficially, the first and second pumps are conductive simultaneously when the bitline voltage is lower than the detection voltage every programming period of programming cycles. The second pump is operable every programming period of programming cycles. The detection is carried out while the bitline voltage is applied to a bitline. In the method, it inactivates the second pump when the bitline voltage rises over the detection voltage every programming period of programming cycles. The bitline voltage is one among an input voltage of a write driver, an output voltage of the write driver, and an output voltage of a column selector.

In another aspect of the invention, a nonvolatile memory device comprises a bitline connected to a memory cell; and a bitline voltage generator configured to generate a bitline voltage to be supplied to the bitline, having current drivability variable in accordance with whether the bitline voltage is less than a detection voltage every programming period of programming cycles.

Beneficially, the bitline voltage generator comprises: first and second pumps; a first detector sensing whether the bitline voltage reaches a target voltage during a programming cycle; a second detector sensing whether the bitline voltage is lower than the detection voltage while the bitline voltage is being supplied; and a pump controller regulating the first and second pumps to be active at the same time in response to outputs of the first and second detectors when the bitline voltage is less than the detection voltage every programming period. The target voltage of the bitline voltage is greater than the detection voltage. The pump controller comprises: an oscillator generating an oscillation signal in response to the output of the first detector; a first clock driver generating a first pumping clock, which is supplied to the first pump, in response to the oscillation signal; a switch transferring the oscillation signal in response to a control signal; and a second clock driver generating a second pumping clock that is supplied to the second pump in response to the oscillation signal transferred through the switch and the output of the second detector. The control signal is active when a bulk voltage reaches a target voltage, while inactive when the bitline voltage is discharged. The device further comprises a write driver activating the bitline with the bitline voltage in accordance with data to be programmed, wherein the second detector senses the bitline voltage output from the write driver. The second detector senses the bitline voltage output from the bitline voltage generator.

In still another aspect of the invention, a nonvolatile memory device comprises a memory cell array of memory cells arranged in rows and columns; a bitline voltage generator outputting a bitline voltage; and a write driver supplying the bitline voltage to a selected column in response to a bitline enable signal every programming period in accordance with data to be programmed. The bitline voltage generator detects whether the bitline voltage is less than a detection voltage in response to activation of the bitline enable signal, and varies current drivability in accordance with a result of the detection.

Beneficially, the bitline voltage generator comprises: first and second pumps; a first detector sensing whether the bitline voltage reaches a target voltage during a programming cycle; a second detector sensing whether the bitline voltage is less than the detection voltage in response to the bitline enable signal; and a pump controller regulating the first and second pumps to be active at the same time in response to outputs of the first and second detectors when the bitline voltage is less than the detection voltage every programming period. The target voltage of the bitline voltage is greater than the detection voltage. The second pump is regulated by the pump controller when the bitline enable signal is being active. The pump controller comprises: an oscillator generating an oscillation signal in response to the output of the first detector; a first clock driver generating a first pumping clock, which is supplied to the first pump, in response to the oscillation signal; a switch transferring the oscillation signal in response to a control signal; and a second clock driver generating a second pumping clock that is supplied to the second pump in response to the oscillation signal transferred through the switch and the output of the second detector. The control signal is active when a bulk voltage reaches a target voltage, while inactive when the bitline voltage is discharged. The second detector is configured to sense a voltage on a selected bitline, a voltage output from the write driver, or a voltage output from the bitline voltage generator.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 1:
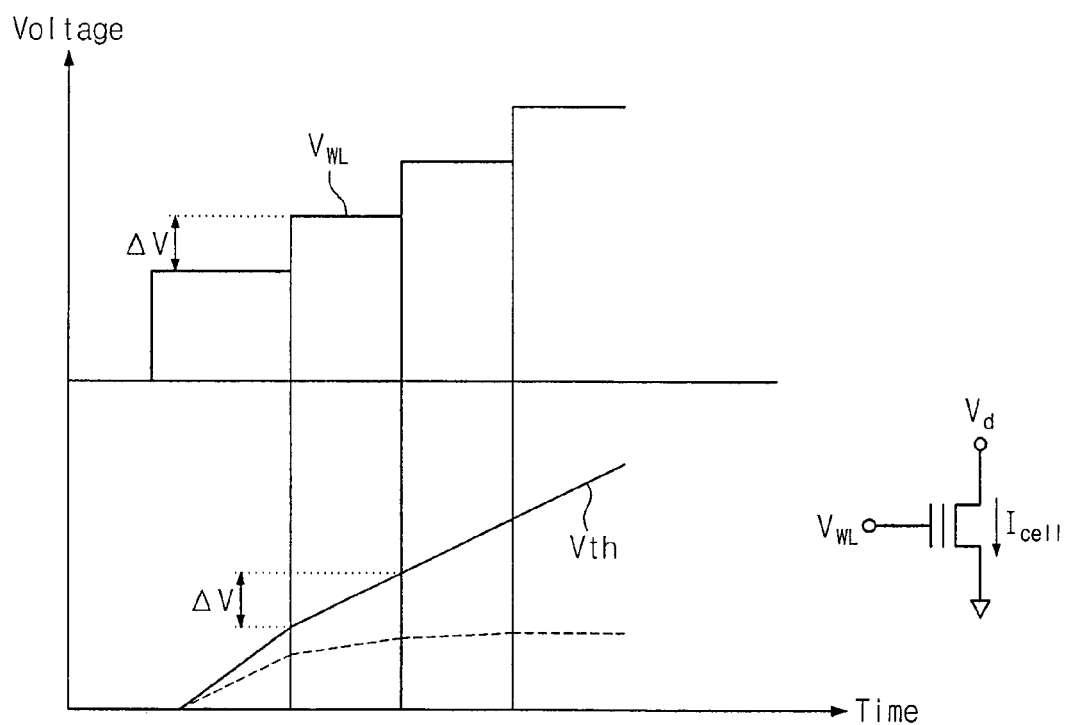
FIG. 1 is a graphic diagram showing variations of wordline and threshold voltages during a program operation in a nonvolatile memory device.
Figure 2:
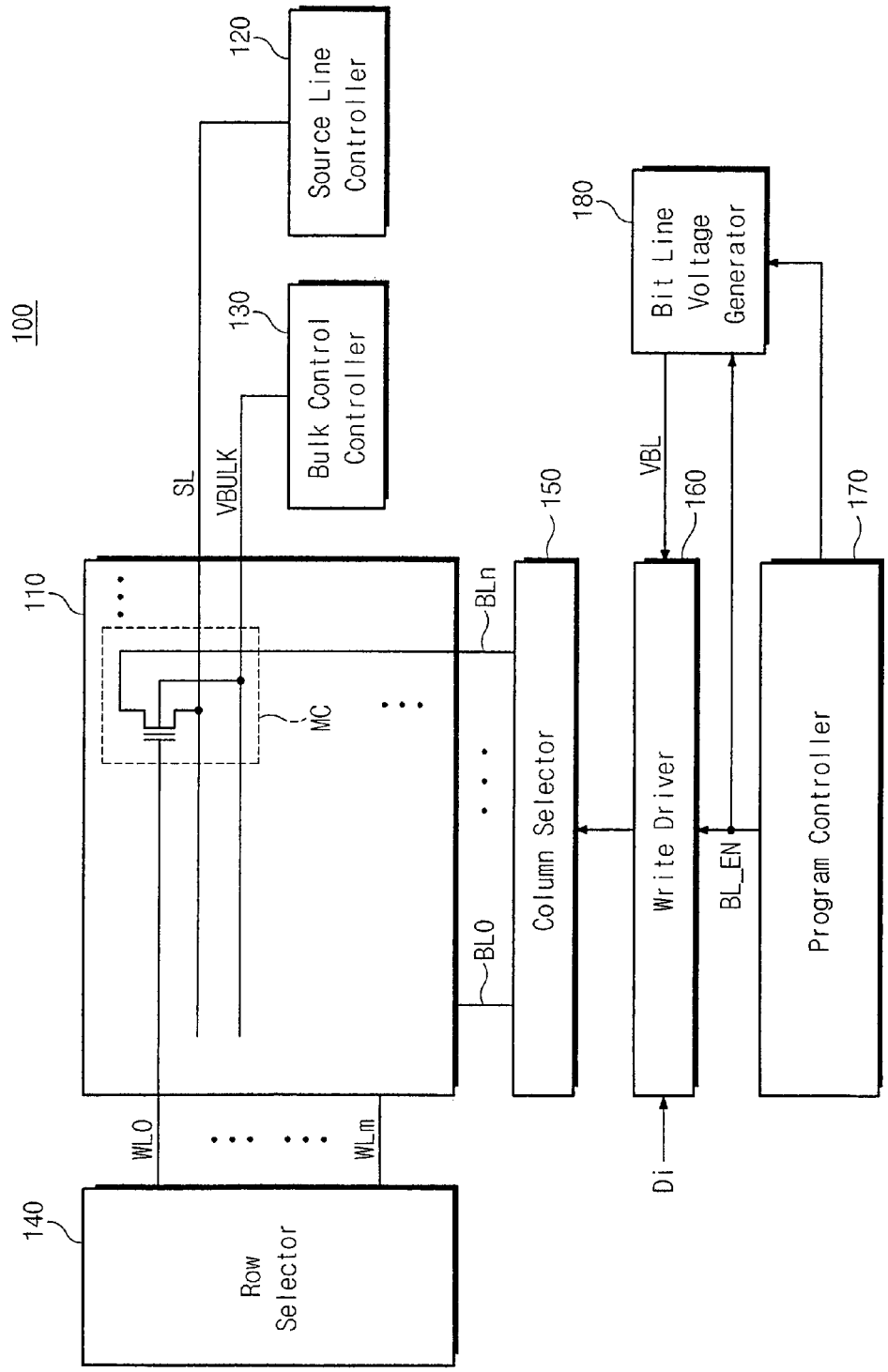
FIG. 2 is a block diagram illustrating one embodiment of a nonvolatile memory device.

FIG. 2 is a block diagram illustrating a nonvolatile memory device 100. The nonvolatile memory device 100 a NOR flash memory device. However, it would be apparent from the description to follow that the principles applicable to the NOR flash memory device 100 may be applicable to other nonvolatile memories (e.g., MROM, PROM, FRAM, NAND flash memory, and so forth).

Referring to FIG. 2, the nonvolatile memory device 100 includes a memory cell array 110 comprised of memory cells arranged in a matrix of rows (or wordlines) and columns (or bitlines). FIG. 2 shows a single memory cell, for convenience of description. The memory cell MC is formed of a floating gate transistor constructed of a floating gate, a control gate, a bulk, a source, and a drain. The control gate of the floating gate transistor is connected to a wordline WL0, its drain is connected to a bitline BLn, and its source is connected to a source line SL. The source line SL is controlled by a source line controller 120 (or source voltage generating circuit). For instance, the source line SL is set to a ground voltage during reading and programming operations, while placed in a floating state during an erasing operation. The bulk of the floating gate transistor is connected to a bulk controller 130 that supplies a bulk voltage VBULK to the bulk. The bulk controller 130 generates −1V or 0V for a programming operation. Although not shown in the drawings, other memory cells are configured with the same construction as the aforementioned memory cell MC.

A row selector 140 selects one of wordlines WL0~WLm in compliance with row address information and drives the selected wordline with a wordline voltage for the corresponding operating mode. A column selector 150 selects a predetermined number of bitlines BL0~BLn (e.g., a byte or a word) in compliance with column address information. A write driver 160 operates in response to a bitline enable signal BLEN provided from a program controller 170, driving the selected bitlines with the bitline voltage VBL, which is supplied from a bitline voltage generator 180, in accordance with input data Di every programming period. For example, if the input data Di is programming data, the write driver 160 activates the selected bitlines, which are designated by the column selector 150, with the bitline voltage BL. If the input data Di is programming inhibit data, the write driver 160 activates the selected bitlines, which are designated by the column selector 150, with a voltage (e.g., the ground voltage) lower than the bitline voltage BL. The program controller 170 activates the bitline enable signal BL_EN each programming period of the programming cycles, and the write driver 160 drives the selected bitlines with the bitline voltage VBL or the ground voltage while the bitline enable signal BL_EN is active.

Continuing with respect to FIG. 2, the bitline voltage generator 180 is controlled by the program controller 170, generating the bitline voltage VBL. The current drivability of the bitline voltage generator 180 is variable in accordance with the bitline voltage VBL each programming period. For instance, the bitline voltage generator 180 operates with a first current drivability when the bitline voltage VBL is greater than the detection voltage (lower than a target voltage of the bitline voltage and higher than the ground voltage), while it operates with a second current drivability, which is larger than the first current drivability, when the bitline voltage VBL is less than the detection voltage. This means that excessive degradation of the bitline voltage VBL is prevented every programming period. As mentioned earlier, a decrease in the bitline voltage VBL during a programming period causes a programming failure. However, in the memory device 100 of FIG. 2, since the excessive degradation of the bitline voltage VBL is prevented in the programming period, the threshold voltage of the memory cell increases by a predetermined level every programming period. Thus, the programming characteristics can be improved. The mechanism of varying the current drivability of the bitline generator 180 will be described below in greater detail with reference to FIG. 3.

Figure 3:
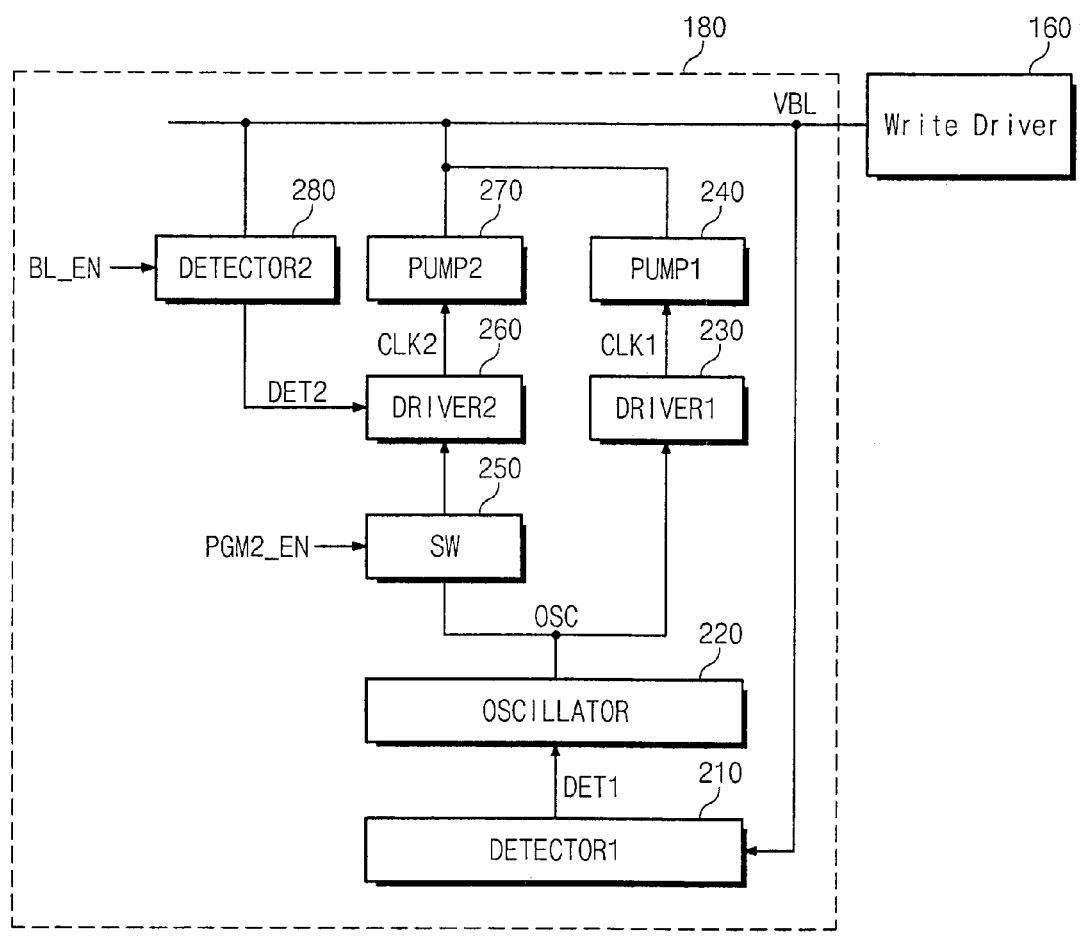
FIG. 3 is a block diagram illustrating an embodiment of the bitline voltage generator shown in FIG. 2.

Referring to FIG. 3 illustrating the bitline voltage generator shown in FIG. 2, the bitline voltage generator 180 includes a first detector 210, an oscillator 220, a first clock driver 230, a first pump 240, a switch 250, a second clock driver 260, a second pump 270, and a second detector 280.

The first detector 210 generates a detection signal DET1 indicating whether the bitline voltage VBL, which is applied to the write driver 160, has reached the target voltage (e.g., 5~6V). As an example, if the bitline voltage VBL has not reached the target voltage yet, then the first detector 210 activates the detection signal DET1. If the bitline voltage VBL has reached the target voltage, then the first detector 210 deactivates the detection signal DET1. The oscillator 220 generates an oscillation signal OSC in response to the detection signal DET1. For example, the oscillator 220 generates the oscillation signal OSC in response to activation of the detection signal DET1, and when the detection signal DET1 is deactivated, then the oscillation signal OSC is interrupted. The first clock driver 230 generates a pumping clock CLK1 in response to the oscillation signal OSC. The first pump 240 conducts its pumping operation in response to the pumping clock CLK1. In response to the first pump 240 being active, the bitline voltage VBL will increase up to the target voltage. The switch 250 transfers the oscillation signal OSC to the second clock driver 260 in response to a control signal PGM2_EN. The control signal PGM2_EN is activated when the bulk voltage VBULK reaches a target voltage (e.g., −1V), and is deactivated when the bitline voltage VBL supplied to a selected bitline is discharged. On the other side, the control signal PGM2_EN is activated when the bulk voltage VBULK reaches a target voltage (e.g., −1V), while it is deactivated when the bitline enable signal BL_EN is inactive.

The second detector 280 is conductive in response to the bitline enable signal BL_EN and determines whether the bitline voltage VBL is higher than a detection voltage Vt3. The detection voltage Vt3 is less than the target voltage (e.g., 5~6V) of the bitline voltage VBL and higher than the ground voltage. The bitline enable signal BL_EN is output from the program controller 170 shown in FIG. 2, being active only during the supply of the bitline voltage every programming period. When the bitline voltage VBL is less than the detection voltage Vt3, then the second detector 280 activates a detection signal, DET2. Meanwhile, when the bitline voltage VBL is greater than the target voltage, the second detector 280 deactivates the detection signal DET2. The second clock driver 260 generates a pumping clock CLK2 in response to the detection signal DET2 and the oscillation signal OSC. When the detection signal DET2 is active, the second clock driver 260 generates the pumping clock CLK2 in response to the oscillation signal OSC, which enables the second pump 270 to be conductive. When the detection signal DET2 is inactive, the pumping clock CLK2 is not generated even though there is an input of the oscillation signal OSC. This means that the second pump 270 does not operate.

In summary, when the bitline voltage VBL is between the target voltage and the detection voltage during a programming period, the bitline voltage VBL is generated and maintained by the first pump 240. When the bitline voltage VBL is less that the detection voltage during a programming period, the bitline voltage VBL is generated and maintained by both the first and second pumps 240 and 270.

In FIG. 3, the oscillator 220, the first clock driver 230, the switch 250, and the second clock driver 260 constitute a pump controller that regulates the first and second pumps 240 and 270 by responding to the detection signals DET1 and DET2 output from the first and second detectors 210 and 280, respectively. The second detector 280 operates during an active period of the bitline enable signal BL_EN. Meanwhile, it is also possible for the second detector 280 to operate every programming period.

Figure 4:
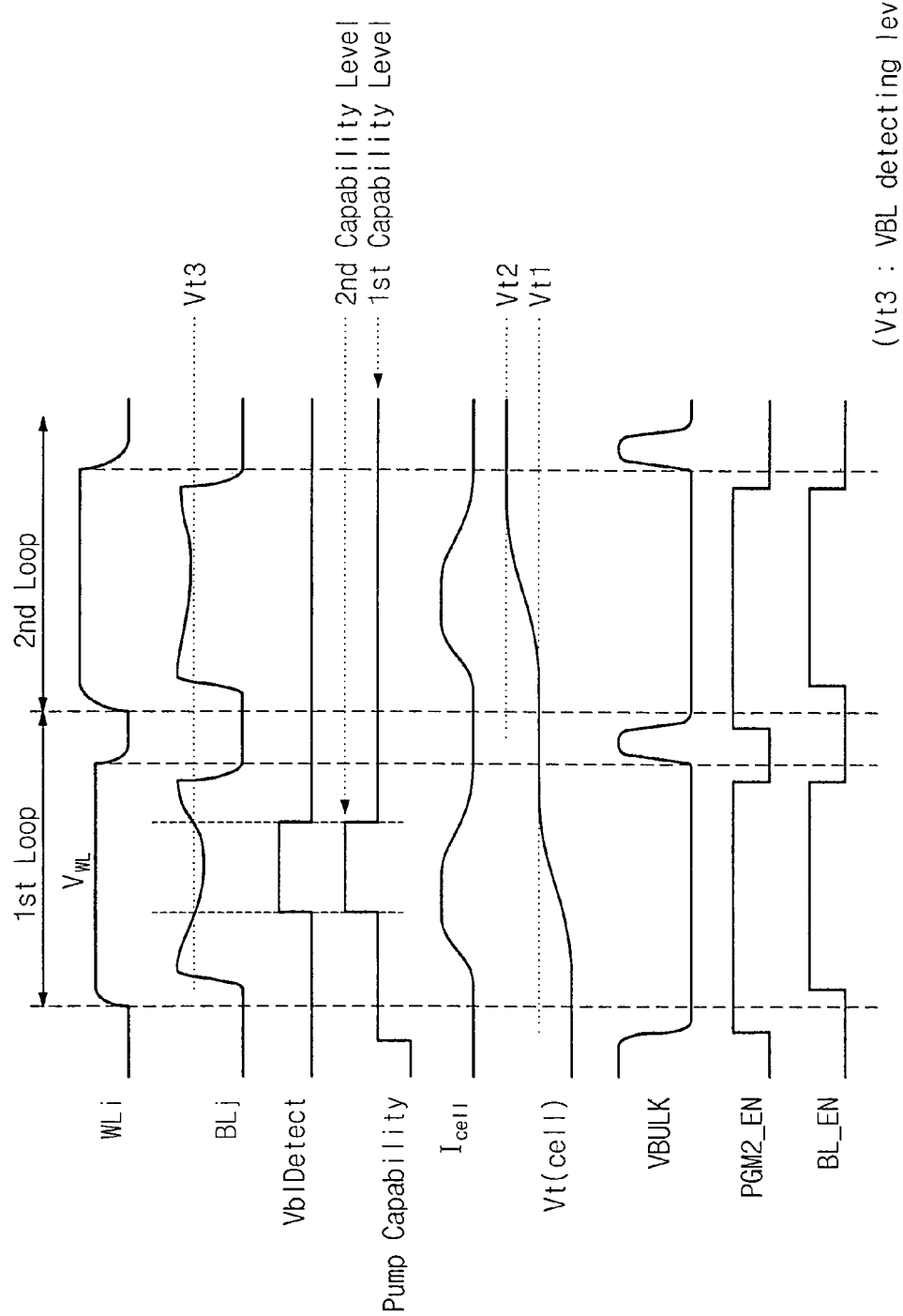
FIG. 4 is a timing diagram showing the sequence of a programming operation in a nonvolatile memory device according to the invention.

FIG. 4 is a timing diagram showing the sequence of a programming operation in the nonvolatile memory device 100. Now, the programming operation of the nonvolatile memory device will be described in detail with reference to FIG. 4. Before description, it should be stated that each programming cycle in the nonvolatile memory device is comprised of a plurality of programming loops, each of which includes a programming period and a programming verifying period. In a nonvolatile memory device using the ISPP scheme, a wordline voltage is gradually increased by a predetermined amount of iterations of the programming loops. Otherwise, in a nonvolatile memory device without the ISPP scheme, a wordline voltage would be maintained at a constant level as the programming loops are repeated.

Once the nonvolatile memory device 100 enters into a programming mode, the bulk controller 130 and the bitline voltage generator 180 begin generating the bulk voltage VBULK and the bitline voltage VBL, respectively. When the bulk voltage VBULK reaches the target voltage, the program controller 170 activates the control signal PGM2_EN. Then, the switch 250 of the bitline voltage generator 180 is activated to transfer therethrough the oscillation signal OSC from the oscillator 220 to the second clock driver 260.

Then, the program controller 170 activates the bitline enable signal BL_EN in a first programming period. With the activation of the bitline enable signal BL_EN, the bitline voltage VBL is supplied to a bitline (or bitlines) selected by the column selector 150. As illustrated in FIG. 4, the bulk voltage VBULK reaching the target voltage (e.g., −1V or 0V) is supplied to the bulk of a selected memory cell, and a wordline voltage is applied to a selected wordline. According to such a bias condition, a threshold voltage of the selected memory cell increases by a predetermined amount. During a programming period, the bitline voltage VBL may decrease due to a current excessively flowing through the selected memory cell. If the bitline voltage VBL drops below the detection voltage, the current drivability of the bitline voltage generator 180 is varied to compensate for the drop in VBL, as described in more detail below.

First, the first detector 210 of the bitline voltage generator 180 detects whether the bitline voltage VBL is less than the target voltage. If the bitline voltage VBL is less than the target voltage (e.g., 5~6V), the first detector 210 activates the first detection signal DET1. The oscillator 220 generates the oscillation signal OSC in response to the activation of the first detection signal DET1, and the first pump 240 begins its pumping operation in response to the first pumping clock CLK1 applied through the clock driver 230. Such feedback operations are repeated to increase the bitline voltage VBL to the target voltage.

While the first pump 240 is operating in a programming period, the second detector 280 operates in response to activation of the bitline enable signal BL_EN. The second detector 280 detects whether the bitline voltage VBL is less than a detection voltage Vt3 during the programming period (or during an active period of the bitline enable signal BL_EN). When the bitline voltage VBL becomes greater than the detection voltage Vt3, the second detector 280 deactivates the second detection signal DET2, which makes the second clock driver 260 inactive. The oscillation signal OSC transferred through the switch 250 is interrupted from being supplied by the second clock driver 260. If the bitline voltage VBL becomes less than the detection voltage Vt3, the second detector 280 activates the second detection signal DET2 as illustrated in FIG. 4. According to the activation of the second detection signal DET2, the second clock driver 260 outputs the second pumping clock CLK2 to the second pump 270 in response to the oscillation signal OSC. Thus, the second pump 270 conducts its pumping operation, enabling the bitline voltage VBL to be higher than the detection voltage Vt3. If the bitline voltage VBL increases to be greater than the detection voltage Vt3, the second detection voltage signal DET2 is deactivated. As a result, the second pump 270 does not operate further.

When a voltage on the bitline is discharged, or the bitline enable signal BL_EN is deactivated, the second detector 280 suspends its detecting operation. At the same time, the control signal PGM2_EN is deactivated to disable the switch 250, which interrupts the supply of the oscillation signal OSC to the second clock driver 260. As mentioned above, the operation of the bitline voltage generator 180 is repeated to keep the bitline voltage VBL greater than the detection voltage Vt3.

When the bitline voltage VBL is lower than the detection voltage Vt3 in a programming period, both the first and second pumps 240 and 270 are conductive to increase the current drivability of the bitline voltage generator 180. As a result, the bitline voltage VBL increases to be greater than the detection voltage Vt3 more rapidly by the simultaneous operation of the first and second pumps 240 and 270. Once the bitline voltage VBL becomes greater than the detection voltage Vt3 in ay programming period, it may be maintained or regenerated by the first pump 240 in the manner mentioned above. While the bitline voltage generator 180 shown in FIG. 3 uses two pumps, other embodiments of the bitline voltage generator may include three or more pumps therein.

Figure 5:
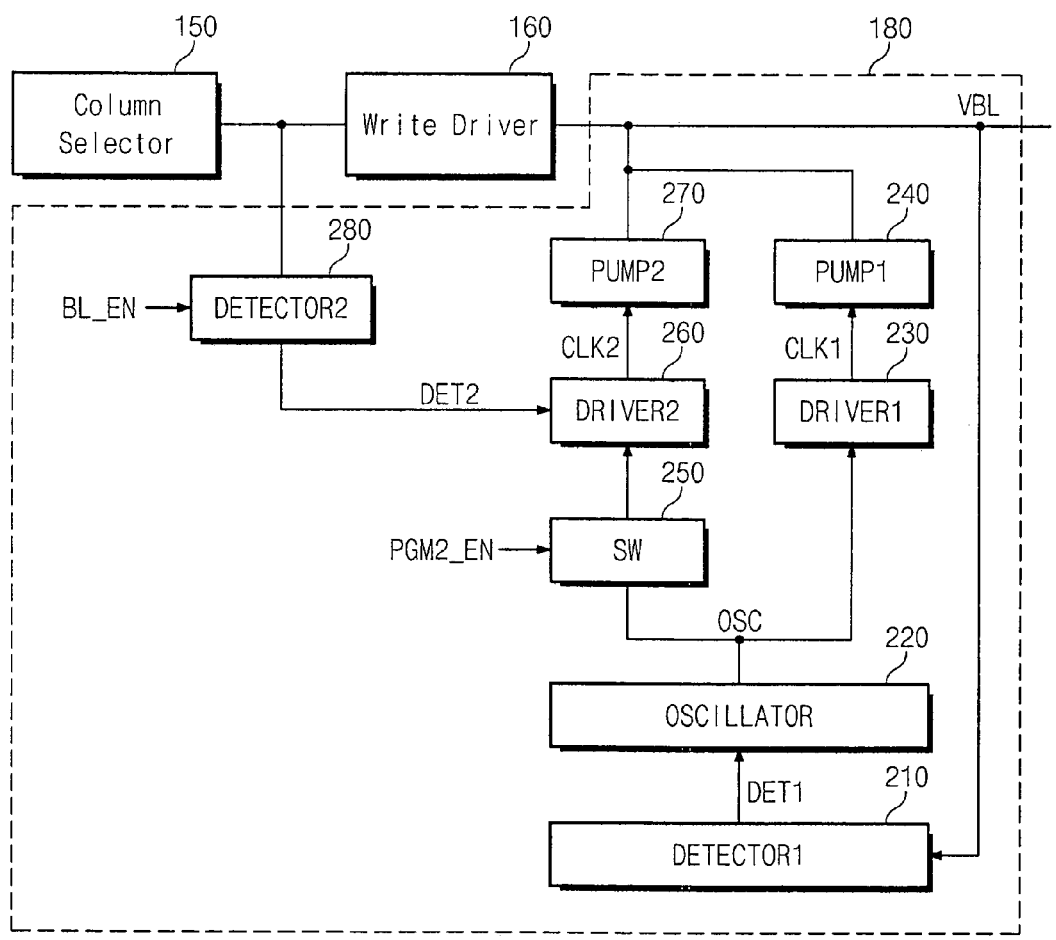
FIGS. 5 and 6 are block diagrams illustrating other embodiments of the bitline voltage generator.
Figure 6:
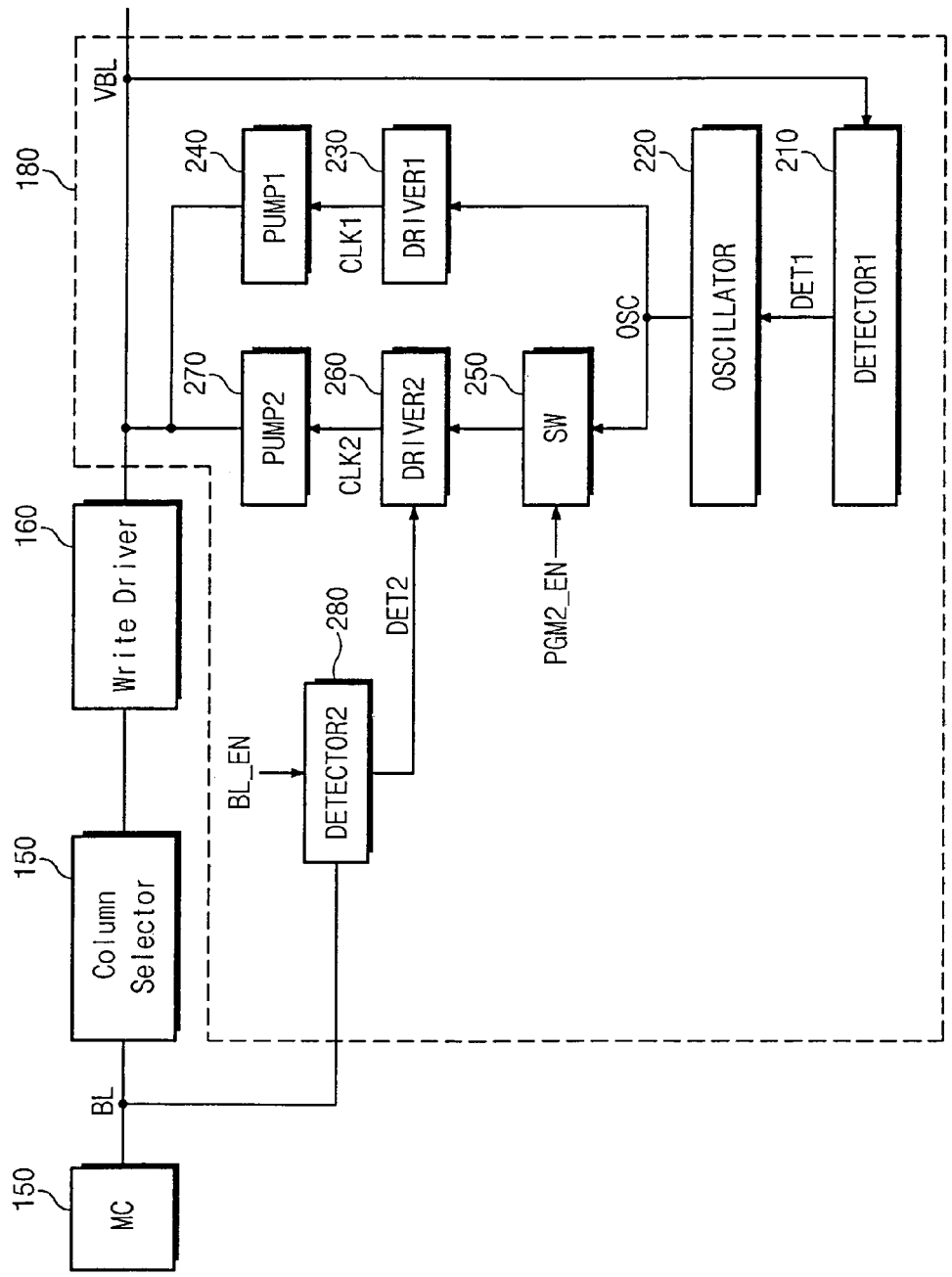

In the bitline voltage generator 180 illustrated in FIG. 3, the second detector 280 is configured to sense the bitline voltage VBL transferred to the write driver 160. Here, the detection voltage by the second detector 280 may be obtained in various sensing locations. For instance, as shown in FIG. 5, the second detector 280 of the bitline voltage generator 180 may be configured to detect the bitline voltage VBL output from the write driver 160. Alternatively, as shown in FIG. 6, the second detector 280 of the bitline voltage generator 180 may be configured to sense the bitline voltage VBL transferred to a bitline (or bitlines) selected by the column selector 150.

As described above, it is possible to prevent a programming failure due to a bitline voltage drop by increasing the current drivability of the bitline voltage generator when the bitline voltage becomes less than the detection voltage.

Although the present invention has been described in connection with the embodiments illustrated in the accompanying drawings, it is not limited thereto but is defined by the scope of the accompanying claims. It will be apparent to those skilled in the art that various substitutions, modifications and changes may be made thereto without departing from the scope of the invention.

What is claimed is:

1. A method of programming a nonvolatile memory device, comprising:
    generating a bitline voltage by activating a first pump;
    detecting whether the bitline voltage is less than a detection voltage after a bulk voltage of the memory device reaches a target voltage; and
    activating a second pump when the bitline voltage is less than the detection voltage.

2. The method as set forth in claim 1, wherein the first and second pumps are conductive simultaneously when the bitline voltage is less than the detection voltage during a programming period of a programming cycle.

3. The method as set forth in claim 1, wherein the second pump is operable during a programming period of a programming cycle.

4. The method as set forth in claim 1, wherein the detecting is carried out while the bitline voltage is applied to a bitline.

5. The method as set forth in claim 1, further comprising deactivating the second pump when the bitline voltage becomes greater than the detection voltage during a programming period of a programming cycle.

6. The method as set forth in claim 1, wherein the bitline voltage is one among an input voltage of a write driver, an output voltage of the write driver, and an output voltage of a column selector.

7. A nonvolatile memory device comprising:
    a bitline connected to a memory cell; and
    a bitline voltage generator configured to generate a bitline voltage to be supplied to the bitline, having a variable current drive capability in accordance with whether the bitline voltage is less than a detection voltage during a programming period of programming cycles;
    wherein the bitline voltage generator comprises:
    first and second pumps;
    a first detector sensing whether the bitline voltage is at a target voltage during a programming cycle;
    a second detector sensing whether the bitline voltage is less than the detection voltage while the bitline voltage is being generated; and
    a pump controller regulating the first and second pumps to be active at the same time in response to outputs of the first and second detectors when the bitline voltage is less than the detection voltage during a programming period.

8. The nonvolatile memory device as set forth in claim 7, wherein the target voltage of the bitline voltage is greater than the detection voltage.

9. The nonvolatile memory device as set forth in claim 7, wherein the pump controller comprises:
    an oscillator generating an oscillation signal in response to an output of the first detector;
    a first clock driver generating a first pumping clock, which is supplied to the first pump, in response to the oscillation signal;
    a switch transferring the oscillation signal in response to a control signal; and
    a second clock driver generating a second pumping clock that is supplied to the second pump in response to the oscillation signal transferred through the switch and an output of the second detector.

10. The nonvolatile memory device as set forth in claim 9, wherein the control signal is active when a bulk voltage reaches a target voltage, and is inactive when the bitline voltage is discharged.

11. The nonvolatile memory device as set forth in claim 7, further comprising a write driver activating the bitline with the bitline voltage in accordance with data to be programmed, wherein the second detector senses the bitline voltage output from the write driver.

12. The nonvolatile memory device as set forth in claim 7, wherein the second detector senses the bitline voltage output from the bitline voltage generator.

13. A nonvolatile memory device comprising:
    a memory cell array comprising memory cells arranged in rows and columns;
    a bitline voltage generator outputting a bitline voltage and detecting whether the bitline voltage is less than a detection voltage in response to activation of the bitline enable signal, and which has a current drive capability that is variable in accordance with a result of the detection; and
    a write driver supplying the bitline voltage to a selected column in response to a bitline enable signal during a programming period in accordance with data to be programmed during the programming period,
    wherein the bitline voltage generator comprises:
    first and second pumps;
    a first detector sensing whether the bitline voltage reaches a target voltage during a programming cycle;
    a second detector sensing whether the bitline voltage is less than the detection voltage in response to the bitline enable signal; and
    a pump controller regulating the first and second pumps to be active at the same time in response to outputs of the first and second detectors when the bitline voltage is less than the detection voltage during the programming period.

14. The nonvolatile memory device as set forth in claim 13, wherein the target voltage of the bitline voltage is greater than the detection voltage.

15. The nonvolatile memory device as set forth in claim 13, wherein the second pump is regulated by the pump controller when the bitline enable signal is active.

16. The nonvolatile memory device as set forth in claim 13, wherein the pump controller comprises:
    an oscillator generating an oscillation signal in response to an output of the first detector;
    a first clock driver generating a first pumping clock, which is supplied to the first pump, in response to the oscillation signal;
    a switch transferring the oscillation signal in response to a control signal; and
    a second clock driver generating a second pumping clock that is supplied to the second pump in response to the oscillation signal transferred through the switch and an output of the second detector.

17. The nonvolatile memory device as set forth in claim 16, wherein the control signal is active when a bulk voltage of the memory device reaches a target voltage, and is inactive when the bitline voltage is discharged.

18. The nonvolatile memory device as set forth in claim 13, wherein the second detector is configured to sense a voltage on a selected bitline.

19. The nonvolatile memory device as set forth in claim 13, wherein the second detector is configured to sense a voltage output from the write driver.

20. The nonvolatile memory device as set forth in claim 13, wherein the second detector is configured to sense a voltage output from the bitline voltage generator.

* * * * *